United States Patent [19]
Biller et al.

[11] Patent Number: 5,935,661
[45] Date of Patent: Aug. 10, 1999

[54] RADIATION CURING OF POWDER COATINGS ON HEAT SENSITIVE SUBSTRATES: CHEMICAL COMPOSITIONS AND PROCESSES FOR OBTAINING COATED WORKPIECES

[75] Inventors: Kevin M. Biller, Columbus; Ben A. MacFadden, Circleville, both of Ohio

[73] Assignee: Herberts Powder Coatings, Inc., Hilliard, Ohio

[21] Appl. No.: 09/059,895

[22] Filed: Apr. 14, 1998

Related U.S. Application Data

[60] Division of application No. 08/592,582, Jan. 26, 1996, Pat. No. 5,789,039, which is a continuation-in-part of application No. 08/301,305, Sep. 6, 1994, abandoned.

[51] Int. Cl.$^6$ .................................................. B05D 3/06
[52] U.S. Cl. ..................... 427/474; 427/493; 427/518; 427/519; 427/521
[58] Field of Search .................................. 427/493, 508, 427/517, 518, 519, 521, 474

[56] References Cited

U.S. PATENT DOCUMENTS

| | | | |
|---|---|---|---|
| 3,876,432 | 4/1975 | Carlick et al. | 96/115 |
| 3,943,046 | 3/1976 | De Sorga et al. | 204/159.23 |
| 3,959,100 | 5/1976 | McGinniss | 204/159.15 |
| 3,966,574 | 6/1976 | LaBash et al. | 204/159.24 |
| 3,970,535 | 7/1976 | McGinniss | 204/159.18 |
| 3,974,303 | 8/1976 | Iwase et al. | 427/27 |
| 4,040,994 | 8/1977 | Lewis et al. | 260/18 |
| 4,058,401 | 11/1977 | Crivello | 96/115 R |
| 4,129,488 | 12/1978 | McGinniss | 204/159.19 |
| 4,163,810 | 8/1979 | McGinniss | 427/54 |
| 4,318,766 | 3/1982 | Smith | 156/330 |
| 4,530,778 | 7/1985 | Nelson et al. | 252/500 |
| 4,645,781 | 2/1987 | Koleske et al. | 522/169 |
| 4,693,961 | 9/1987 | Bauer | 430/325 |
| 4,786,666 | 11/1988 | Cecil et al. | 523/427 |
| 4,840,978 | 6/1989 | Koleske et al. | 528/361 |
| 4,892,894 | 1/1990 | Koleske | 522/31 |
| 4,962,179 | 10/1990 | Corley | 528/90 |
| 4,977,199 | 12/1990 | Koleske et al. | 528/361 |
| 5,068,305 | 11/1991 | Meixner et al. | 528/49 |
| 5,102,772 | 4/1992 | Angelo et al. | 430/280 |
| 5,158,989 | 10/1992 | Ogitani et al. | 522/77 |
| 5,227,453 | 7/1993 | Elmore et al. | 528/104 |
| 5,264,325 | 11/1993 | Allen et al. | 430/280 |
| 5,300,331 | 4/1994 | Schaeffer | 427/493 |
| 5,318,808 | 6/1994 | Crivello et al. | 427/517 |
| 5,494,618 | 2/1996 | Sitzmann et al. | 264/401 |
| 5,525,645 | 6/1996 | Ohakawa et al. | 522/74 |
| 5,539,014 | 7/1996 | Swedo et al. | 522/91 |

FOREIGN PATENT DOCUMENTS

| | | |
|---|---|---|
| 0 636 669 A2 | 12/1995 | European Pat. Off. . |
| 6-210241 | 8/1984 | Japan . |

OTHER PUBLICATIONS

Dietmar Fink and Gerhard Brindöpke, "UV Curing Powder Coatings for Heatsensitive Substrates", European Coatings Journal, Sep. 1995.

F.M. Witte, G. Dieft, H.J. Stuiver, F. Twigt and R. van der Linde, "Radiation Curable Powder Coating System", RADTECH European 95, Conference Proceedings, Sep. 25–27, 1995, pp. 437–444.

Detroit Society for Paint Technology, Technical Subcommittee on Powder Coating, Joseph Smarsh, Chairman, "Powder Coating: Why–How–When". Journal of Paint Technology, vol. 44, Feb. 1972, pp. 30–37.

Daniel R. Savage, "Powder Coating: A Look at Equipment and Materials", Products Finishing, Jan. 1972, pp. 40–51.

Michael Wittig and Thomas Gehlmann "Radiation Curing of Powder Coating", RADTECH Europe Conference, 1993, pp. 533–544.

"Powder Coating: Why–How–When", Journal of Paint Technology vol. 44 Feb. 1972, J. Smarsh, pp. 30–37.

*Primary Examiner*—Erma Cameron
*Attorney, Agent, or Firm*—Trop, Pruner, Hu & Miles, P.C.

[57] ABSTRACT

The present invention relates to powder coatings curable by exposure to radiation, typically ultraviolet radiation. Powder coatings based upon cationically catalyzed resins (typically epoxy resins) are described including bisphenols, bisphenols modified by novolac, as well as aliphatic type epoxides including hydrogenated bisphenol-A, glycidyl methacrylic, glycidyl acrylics or related compounds, and vinyl ethers including mixtures of the foregoing compounds. Photoinitiators of sulfonium type, ferrocinium type, iodonium type, triphenolic types and related compounds are also included. Opacifiers, flow agents and plasticizers are also included. Charge additives for improved electrostatic deposition of the power coating are also described. Degassing agents are also typically included in the formulation, both for degassing the powder coating during cure, and to assist in degassing those substrates (such as wood) which tend to form bubbles during cure. Flow agents are also typically included in the formulation. Solidification of photoinitiators prior to use, and the addition of hydroxyl polyesters are shown in the present invention to lead to improved curing and coating performance. Additives are also described which permit the powder coating to flow at temperatures below 100 degrees Celsius, thereby allowing powder coatings to be employed on heat-sensitive substrates such as wood.

16 Claims, No Drawings

RADIATION CURING OF POWDER COATINGS ON HEAT SENSITIVE SUBSTRATES: CHEMICAL COMPOSITIONS AND PROCESSES FOR OBTAINING COATED WORKPIECES

RELATED APPLICATIONS

This application is a continuing prosecution application (divisional) of application Ser. No. 08/592,582 filed Jan. 26, 1996, now U.S. Pat. No. 5,789,039 which is a continuation-in-part of application Ser. No. 08/301,305 filed Sep. 6, 1994, now abandoned.

FIELD OF INVENTION

This invention relates to the general field of coating technology, and more specifically, to the field of powder coating technology. In particular, this invention relates to chemical compositions for powder coatings which permit application to various substrates using substantially conventional powder coating application techniques yet can be cured by ultraviolet or similar radiation without the necessity of thermally curing the coating as deposited on possibly heat sensitive substrates; and further relates to chemical compositions and methods of application for the coating to produce acceptable coatings on heat sensitive substrates without incurring damage from thermally flowing the applied powder into a film prior to final radiation curing, in particular, relating to formulations and methods of use for powder coatings cured by ultraviolet radiation in which cationic curing chemical mechanisms of various epoxide compounds, vinyl ethers, or related compounds are employed, in combination with property-enhancing additives, and ultraviolet photoinitiators, preprocessed for specific use with powder coatings.

BACKGROUND OF INVENTION

This invention relates to a marriage of two important fields of technology, each of which has experienced significant commercial importance, research interest and technical advances. Powder coating technology occupies a significant and growing place in the overall worldwide market for coatings, developed partially in response to the necessity for reducing solvent or other volatile component emissions related to improving air quality and reducing worker exposure to hazardous chemical vapors. There are numerous and critical differences between powder and liquid coatings related to their differing chemistries, methods of manufacture, methods of application, methods of film formation, methods of curing, and worker safety precautions. These are described in detail below.

In parallel with the development of powders as an alternate coating technology to conventional liquid coatings, much work has been devoted to the formulation of liquid chemical compositions for coatings curable by exposure to radiation, typically ultraviolet radiation ("uv"). A vast technical field has developed around uv curable liquid coatings and their special chemical compositions and processing concerns. It is only relatively recently that the community of coating technologists has considered the marriage of liquid uv curable chemical compositions with powder coating technology. In doing so, the full range of inherent and critical differences between the chemistry and technology appropriate for liquid coatings, versus that appropriate for powder coatings, must be met and overcome once again; this time involving uv curable chemical compositions rather than the conventional thermally cured powder coatings. It is this marriage of two diverse but important technologies, uv curable liquid chemical compositions with powder coating technology, to which the present invention is addressed.

Thermally cured powder coatings have numerous and marked distinctions and points of difference from traditional liquid or solvent-borne coatings. Considerable research and engineering development were required to make powder coatings into the commercially significant family of products they are today. Mere reapplication of chemical formulations useful in liquid or solvent-borne coatings was insufficient to produce commercially useful, thermally cured powder coatings (typically in the form of thermosetting powder coatings, although thermoplastic powder coatings still find important applications). Very analogous problems must be encountered and overcome in the development of uv curable powder coatings. Simply to transcribe compositions and formulations from those known in the field of liquid or solvent-borne uv curable coatings into a powder form is far from sufficient for the production of a useful uv curable powder coating. In order to make these distinctions clear, we point out a few of the differences between powder and liquid coatings which necessitated novel approaches in the development of thermally curable powder coatings. Analogous differences must be dealt with and overcome in producing a commercially useful uv curable powder coating, the accomplishment of which constitutes an important part of the present invention.

The manufacture of powder coatings is significantly different from that appropriate for liquid or solvent-borne coatings. Although often referred to as "powder paint", the method for producing powder coatings is much closer to that of producing plastic than it is to producing liquid or solvent-borne coatings. For economy of language we will refer herein to both liquid or solvent-borne coatings as "liquid" intending thereby to include coatings applied in a liquid state whether the coating itself is entirely liquid or is dissolved in a solvent. Typically, powder coatings are compounded in a dry blending, melt compounding, extrusion, cooling, shearing, grinding and classification as to powder grades. Liquid coatings are typically blended as liquids, making use of sand mills, bead mills or various types of blade mixers.

The method of manufacture also has an effect on the types of chemical compositions which can be employed. While liquid coatings can typically be diluted, the melting of conventional powder coating ingredients during the production process precludes the use of highly reactive coatings which might not survive melt compounding unreacted. Similar considerations complicate the formulation of uv curable powder coatings, which must have compositions which, like thermally curable powders, will survive the melt compounding and the production of powders essentially unreacted. The development of chemical compositions suitable for manufacture as a powder yet curable by radiation is one of the objects of the present invention.

The physical characteristics of the powder coating compared to the liquid coating also dictate certain limitations on the chemical compositions which might be used. If the molecular weight of the resin is too low (or if the glass transition temperature, $T_g$, is too low, typically less than about 35 degrees Celsius), such a resin would be unsuitable as a powder coating due to its lack of physical stability during compounding, storage and application. Liquid coatings are not subject to this limitation on $T_g$ or molecular weight since high $T_g$ compounds are typically dissolved in a solvent and can be applied by conventional liquid coating techniques in this form. Of course, compounds which are liquids at room temperature are not suitable for use with powder coatings, tending to cause agglomeration and poor storage and application properties, even when present in relatively small amounts.

Liquid coatings and solid powder coatings inherently have restrictions on the chemical compositions due to the physical nature of the application and film forming process. As a powder, highly reactive species are disfavored, typically requiring the use of "blocking agents" to reduce the reactivity (i.e., secondary aliphatic and aromatic amines are contraindicated as hardeners for typical epoxy powder coatings due to the high reactivity of the system, even though such species may be solid at room temperature). Powder coatings are typically applied by means of electrostatic deposition (although fluidized bed, sprinkling or other coating processes are also employed). Liquid coatings are typically applied by spraying, rolling, dipping, curtain application or similar techniques. Thus, "charge control agents", "flow control agents" and the like are commonly used in conjunction with powder coatings. In contrast, control of viscosity in liquid coatings is critical.

The dynamics of film formation is quite different in powder coatings from liquid coatings. Liquid coatings form a film typically by release of solvent (if present) and curing of the molecular species more or less in place following the deposition of the liquid coating. In this regard, surface tension and viscosity effects are critical parameters in determining film formation. Powder coatings, in contrast, need to be melted for coalescence into a film prior to (or contemporaneous with) curing to generate the final coated workpiece. Thus, for powder coatings, rheology, particle size effects (i.e. cannot be too large) and viscosity as a function of temperature become critical parameters. Thus, physical as well as chemical transformations are important in the formation of a coating film from a powder coating deposited on a workpiece. In contrast, typically only chemical properties are important in the formation of a film from a liquid coating, following deposition on the workpiece.

The safety precautions for the workers are also quite different for the application of powders as compared to liquid coatings. Dust and respiratory protection are the primary considerations in the application of powder coatings, while vapor emissions (inhalation, dermal penetration) are the primary concerns with solvent or monomer emissions from liquid coatings.

In summary, the technology of liquid coatings is markedly different from that of powder coatings. We have highlighted herein some of the important distinctions which had to be met and overcome in the successful creation of thermally cured powder coatings as a commercially significant technology, even in view of significant technical knowledge related to the chemistry and physics of liquid coatings. When attempting to utilize what is known about uv curable liquid coatings in the creation of uv curable powder coatings, many of these same technical challenges need to be treated, as modified to account for the uniquely different chemistries and curing mechanisms involved. This is an important object of the present invention.

Increasing use is being found in industrial applications for photopolymerizable coatings as applied in the form of a liquid or solvent-borne coating (referred to as "liquid" hereinafter for economy of language). By "photopolymerizable coating", we mean a coating deposited upon a substrate or workpiece in which the curing step to form the final coating firmly affixed to the substrate is performed by means of exposure of the coating to some form of radiation. In typical applications, exposure to ultraviolet ("uv") radiation is the preferred means of curing. Typical uv radiation is sufficiently energetic to be a useful initiator of certain chemical reactions when a suitable photoinitiating chemical species is present. One of the advantages of using uv radiation is that, for typical wavelengths used for photocurable coatings, these uv wavelengths are not commonly present as a significant component of background visible radiation to which the coating may be exposed during handling or storage, incidental to the coating process, or during subsequent use of the coated article (tending to cause discoloration or hazing of the coating). Among the disadvantages of uv radiation as a curing agent is the relative expense and safety in the production and use of uv. Therefore, as an alternative to uv curable coatings, certain visible wavelengths may also provide initiation of photopolymerization when used in conjunction with the appropriate light-absorbing chemical species. Work along these lines is continuing as most typically applied to liquid coatings. Visible light as a photoinitiating radiation suffers from the disadvantages noted above related to accidental or incidental exposure, but also suffers from the disadvantage of being much less energetic, photon for photon, than uv. This requires the use of different chemistry, typically related to dyes or other molecular species having relatively large regions of conjugated unsaturations for purposes of lowering the predominant absorption energies from the uv to visible spectral regions.

In addition, electromagnetic radiation more energetic than uv (such as x-ray) may provide initiation of photopolymerization. Also, exposure to electron beams may be used as the means to initiate polymerization of the coating and, hence, cure. One of the advantages of using electron beams is the fact that the incident electron is typically sufficiently energetic to initiate the reaction directly without the intervention of special photoinitiating chemical species. The oligomers of the coating to be cured directly interact with the incident electron beam to form the species necessary to react further without the need for photoinitiators to be added to the mixture. However, such processes must typically be carried out in a vacuum as the electron beam does not significantly penetrate air, thus adding to the complexity of such processes for industrial, production applications. Electron beam equipment is typically very costly compared to other sources of photoinitiating radiation.

For the purposes of the present invention we will use the term "ultraviolet" or "uv" to denote radiation which is used to initiate photopolymerization other than by thermal means. The invention described herein is not intended to be limited thereby to exclude exposure to other forms of radiation, such as electron beams or radiation more or less energetic than uv (typically x-rays or visible radiation respectively), which in specific instances initiate photopolymerization (as distinguished from thermal curing), unless specifically stated in conjunction with the particular compounds or chemistry under consideration. Since ultraviolet is expected to be the preferred radiation for the practice of the chemistry of the present invention, we will use the term "uv" for economy of language.

There are several reasons for the increasing interest in uv curable coatings, although the great majority of work thus far has been directed to liquid, not powder coatings as in the present invention. Typically, uv curable coatings are applied to the substrate to be coated without significant amounts of solvent present in the formulation. In one common approach, uv curable coatings applied in the liquid form are delivered in a mixture of monomers, which polymerize rather than evaporate in the subsequent uv cure. Therefore, the curing step involves polymerization of the coating without significant drying. Hence, insignificant (or greatly reduced) amounts of emissions into the air are present when uv curable coatings are used. Environmental concerns for exposure of the workers engaged in the coating process, as well as the general population concerned with improving air quality, are thereby served. While reducing solvent emissions into the air is an advantage of liquid uv curable coatings, the powder uv curable coatings described herein typically reduce emissions even futher.

However, even for uv curable liquid coatings, if application by spraying is desired, it is frequently necessary to use solvents or low molecular weight monomers as additional components or diluents for the liquid coating, introducing emission and worker exposure concerns all over again. This is yet another contrast with powder coating technology in which application by spraying (typically electrostatic spraying) is the norm without the need for additional volatile components.

Typical uv curable coatings employ less energy than thermal cures and typically require significantly less cure time. Reduction of the energy required for the curing of the coating clearly is advantageous in reducing process costs. Reduction of curing time reduces the quantity of work-in-progress for a given rate of production. This results in savings in terms of the costs associated with the product flowing through the coating process. Also, reduced curing time allows the coating industry to respond more rapidly to customer preferences and specific orders, much in keeping with the modem trend to "just in time" manufacturing.

Additionally, less factory floor space is typically required for uv curing systems than is commonly the case for other means of curing, leading to cost reduction by lowering the investment required in building space and the expenses of building maintenance, utilities, etc.

It is commonly the case for uv curable coatings that additional coatings may be applied immediately following the uv cure. Such immediate recoatability is not typically the case for most conventional coating and curing processes.

The general field of photochemistry, and the particular field of photoinitiated polymerization, is a large and active one with an extensive literature and significant continuing research. In order to fix terminology, we will review here some of the basic concepts of photopolymerization.

The initial step in photopolymerization reactions is the transfer of energy from the incident radiation (electromagnetic or otherwise) to the chemical system to be photopolymerized. There are two general categories of interaction mechanism by which this may occur.

In one instance, the incident radiation is absorbed by an absorbing molecule within the chemical system, but the absorbing molecule is not itself consumed in subsequent chemical reactions. In this case, the absorbing molecule is generally termed a "photosensitizer" since it acts as a photocatalyst; promoting chemical reactions without itself being consumed. The incident radiation in this case results in the excitation of internal energy states of the photosensitizer. Typically, the internal excitations will involve electronic excitations of low lying electronic states of the photosensitizer, but other modes of internal excitation are also possible (such as vibrational, rotational or combinations of electronic with vibrational and rotational modes). The excited photosensitizer then undergoes intermolecular energy transfer, transferring its internal energy thereby to another molecule (sometimes referred to as a "photoinitiator") which is the initiator of the polymerization reaction. By means of this intermolecular energy transfer, the photosensitizer is returned to its original state (typically the ground state), ready for further excitation by incident radiation.

However, strict photocatalysis (in which all of the photoabsorber is regenerated for additional uv absorption) has some disadvantages when used for the curing of coatings on surfaces. Typically, except for very thin coatings, the incident curing radiation will not penetrate effectively throughout the entire thickness of the coating, leading to faster or more complete curing on the surface than in lower layers. It is, therefore, useful for the photoinitiator to become slowly ineffective at absorbing radiation, permitting greater penetration of the curing radiation through the upper levels of the coating to reach (and cure) the lower levels. Such "photobleaching" must occur at a rate slow enough to permit complete curing of the upper surface before the photoinitiating species is destroyed, but rapid enough to allow curing of lower layers in reasonable times. Such photobleaching chemicals and mixtures are the subject of active research and will be increasingly useful for thicker coatings in which penetration to lower levels is more difficult, and for pigmented coatings in which penetration of the radiation through the coating is further hindered by the color-carrying pigmented additives.

Another general category of initiation mechanism for photopolymerization reactions is that in which the radiation is absorbed by the molecule which begins the first step of the polymerization reaction. That is, the radiation absorber is consumed in the reaction as the chain initiator for subsequent polymerization. This is generally referred to as "photoinitiator". Typically, the photoinitiator will be excited, fragmented or ionized by means of its interaction with the incident radiation. The resulting species initiate polymerization and are consumed by the reaction. Thus, radiation must be absorbed by a supply of photoinitiators, continuing until the photoinitiators are consumed.

Photocatalysis (via a photosensitizer) and photoinitiation (as defined herein) are very different conceptual chemical processes: one leading to consumption of the radiation-absorbing species, one not. However, the actual terminology as commonly used in the field is not so precise. "Photoinitiator" is generally used to mean any species which interacts with the incident radiation, whether consumed in the reaction or not. Thus, common usage has photosensitizer as a subclass of the class of photoinitiators. The present invention does not critically distinguish between the use of photosensitizers and the use of (noncatalytic) photoinitiators. Therefore, we will adopt the common usage herein and use "photoinitiator" to encompass both catalytic photosensitizers and consumable photoinitiators. Specific distinctions will be made where necessary.

Our prior description is directed at the most common case of photoinitiation. That is, incident radiation is absorbed by a molecule leading to excitation and intermolecular energy transfer (in the case of photosensitizers), or excitation, fragmentation or ionization followed by initiation of polymerization (in the case of non-catalytic photoinitiators). However, other mechanisms are possible. The absorbing species need not be a separate or distinct molecule, but may be a specific functional group contained as a portion of a molecule in such a chemical environment that the functional group may be treated as a nearly-distinct species for purposes of interaction with incident radiation. Also, the specific functional group may itself interact with the incident radiation, or it may alter the characteristics of its host molecule leading to absorption of radiation directly by the host (which itself is thereby the photoinitiator). For purposes of the present invention, we treat as "photoinitiation" any such mechanism of interaction with incident radiation promoting subsequent chemical reaction.

In the above discussion we referred to "absorption" of the incident radiation. While this is perhaps the predominant mechanism in use for photopolymerization, the incident radiation need not be fully absorbed by the photoinitiating species. It is merely necessary that the incident radiation transfer energy to the photoinitiating molecule and thereby initiate subsequent polymerization. The incident radiation may be fully absorbed in the process of transferring energy, or it may simply be scattered by the photoinitiator, leaving some energy behind ("inelastic" or "Raman scattering"). Absorption is probably the most common mechanism when uv or other electromagnetic radiation is used for photopolymerization (although inelastic scattering is not ruled out). However, when electron or other particle beams are used to initiate photopolymerization, inelastic scattering tends to predominate over absorption. That is, the incident beam of electrons is more likely to initiate photopolymerization by means of electromagnetic energy transfer as the charged electron flies by the photoinitiating molecule, rather than become absorbed to create a negative ion. However, electron capture to form a negative ion is similarly not ruled out. In discussions of the present invention, we will loosely use "absorption of radiation", "photoinitiation" and like terms to denote any, all, or any combination of photoinitiation mechanisms such as described herein or known in the field.

For purposes of discussion of the present invention, we will be primarily concerned with two classes of polymerizations. The first general class is the "cationic cure" in which positively charged chemical species are the primary mechanism for curing the polymer. Epoxy resins are among the most commonly used of such cationic systems. Epoxy resins are generally known in the field for their resistance to chemical attack, flexibility, and good adhesion. Modification of epoxy resins may be done in conjunction with other resins such that cross linking between the reactive epoxide group and other reactive groups (such as amine, carboxyl amide, anhydride, hydroxyl, etc.) can occur. In general, epoxy resins have been among the most useful coating materials for use with uv cationic curing. The conventional usage in the industry is to denote compounds containing —OH functionality by either "hydroxy" or "hydroxyl" interchangeably. While precise chemical rules of nomenclature may prefer "hydroxy" in this instance, we follow the custom in the industry and use these two terms interchangeably.

In addition to cationic cured resins, free radical systems are also commonly used. In these systems, the chemical species primarily responsible for the curing reactions involves a free radical. The common types of resins in use are generally acrylates (typically epoxy acrylates, urethane acrylates, polyester acrylates, polyether acrylates), acrylated oils, unsaturated polyesters, maleates, vinyl/acrylics, polyene/thiol systems, and others.

The use of uv curable coatings may (but need not) involve two conceptually distinct polymerization reactions. The coating formulation may consist of monomers, oligomers, or a polymer which has remaining functionality which will typically be reacted (polymerized) in the curing step. After being applied to the substrate, the subsequent curing step involves polymerization of the coating to form the final cured coating on the substrate. If the coating is applied in the form of monomers, the curing polymerization is the only polymerization reaction carried out in the process. This is most common for uv curable coatings applied in the form of a liquid. However, it is frequently the case for liquid as well as for solid coatings that, prior to application to the substrate and subsequent curing, the coating itself has been fully or partially polymerized. Thus, the coating applied in this partially polymerized form is typically known as an "oligomer" or "prepolymer." The curing of the powder coating on the surface then causes remaining functionality to react to form the final coating. Therefore, some powder coating materials prior to curing may be designated as polymers along with specific functionality remaining to be reacted during curing (i.e. "polyester acrylates," "unsaturated polyesters," etc.) whereby it is understood that previously polymerized materials are applied to the substrate and the remaining functionality reacts during curing. However, in the present coating formulations, a mixture of prepolymer and monomeric species may applied, for example, an acrylourethane (monomer) and unsaturated polyester (prepolymer). We denote by "resin" any such monomer, oligomer or prepolymer, or mixtures thereof applied to the substrate and subsequently cured to form the final coating.

The discussion thus far of cationic and free radical curing upon exposure to uv radiation has been primarily derived from liquid systems used for the formation of uv-curable coatings. It is a primary purpose of the present invention to describe formulations of uv curable coatings suitable for application as powders. The application of a coating in the form of a powder eliminates all use of solvents or liquid monomers, substantially eliminating emissions to the air.

Powder coating technology has found wide usage in the application of coatings to numerous articles of commerce. It has been especially important in the coating of office furnishings, household appliances, shelving, yard furnishings, garden tractors and other equipment, certain automotive parts, and numerous other products. There are several reasons for the increasing utility of powder coating. Powder coating technology typically does not use solvents which otherwise provide a health hazard for the workers exposed to such solvents throughout the working day. Solvent emissions are increasingly an air pollution concern as well. Such solvents additionally cause serious environmental problems in planning and managing their disposal as waste following the coating process. The absence of solvents as an item of expense also leads to cost savings for most powder coating processes.

UV curable coatings applied as a liquid typically are deposited on the substrate in a solution of monomers. Monomer liquids have many of the same drawbacks as do solvents in contributing to environmental pollution and increasing hazards to the health of the workers. Therefore, the present invention is directed at the use of uv curable powder coatings, eliminating thereby both solvent and monomer emissions into the environment.

Typical powder coatings can be collected for reuse, thereby reducing the amount of waste materials. Reduction of waste reduces the cost of the process by reducing the cost of materials not effective in the production of the desired coating, as well as reducing the costs of disposing of waste in an environmentally acceptable manner.

The typical application method for powder coatings involves electrostatic deposition. The substrate (typically an electrical conductor) is connected to electrical ground. Powder coating is electrostatically charged, and thereby attracted to the substrate by electrostatic forces.

There are two general methods for causing the powder coating to become electrically charged; corona charging and tribocharging. The corona charging procedure involves the production of a corona discharge in the air surrounding a suitable electrical discharge device. The powder coating is propelled through the corona discharge region, acquiring thereby an electrostatic charge. The corona charging method typically produces more charge on the powder, thereby increasing the deposition on the substrate. However, the corona typically produces a greater mix of charged species in addition to the desired charged powder. In some applications, the presence of free ions produced by the typical corona is not a serious disadvantage. However, for other applications in which uniformity of charge on the powder coating is a concern, or the presence of free ions otherwise interferes with the coating process, the corona charging method many not be the preferred technique.

The second method in common use for charging the powder coating for deposition involves tribocharging in which rubbing and frictional forces between the powder and another material causes an electrostatic charge to be created on the powder. In one common approach, the powder is typically passed through a long tube by rotation in a spiral configuration. The friction of the powder with the walls of the tube leads to the acquisition by the powder particle of an electrostatic charge. A typical tribocharging unit of this type would have numerous tubes collected into a spiral bundle configuration, typically at least one meter in length to insure adequate tribocharging of a sufficient fraction of powder particles. Introduction of the powder into one end of the bundle, followed by rotation, causes charged powder particles to emerge from the other end. While this procedure is one method of tribocharging, others techniques involving reciprocating motion, etc, are, or soon will be, commercially available.

Tribocharging eliminates the need for high voltage coronas, thereby increasing the safety of the operator and tending to decrease process costs. However, the key characteristic in the selection of tribocharging over corona charging is often the different characteristics of deposition which may be achieved with tribocharging. It is conventionally believed that tribocharging tends to produce a more uniform charging of the powder. The lack of free ions and increased uniformity of charge causes tribocharging to yield superior coating properties for many powder coating applications. In addition, the charging of the powder coating is more easily controlled when tribocharging is employed. The length and material of the tribocharging bundle (for the typical spiral bundle tribocharging device) can be adjusted to allow for a wide range of charging characteristics of the powder to be applied. Similar ease of processes control may be envisioned for other tribocharging devices as they become available.

Once deposited on the substrate, the powder coating is cured to its final finish, typically in the prior art by means of heat, either by passage through a curing oven at the appropriate temperature for the appropriate time, or by irradiation by means of infra-red lamps of the required intensity and wavelength to which the workpiece is exposed for the required period of time.

Electrostatic deposition of typical powder coatings onto conducting substrates provides significant advantages in coating textured surfaces, or other small or hard-to-access regions of a workpiece. The electrostatic attraction of the grounded substrate in regions as yet uncoated by powder in preference to those regions having (typically insulating) powder coatings thereon, tends to attract powder uniformly to all regions of the workpiece.

Powder coatings typically involve a complex mixture of chemicals. In addition to a color-carrying pigment, a typical powder paint would have one or more resins, one or more curing agents, flow and leveling agents, degassing agents, waxes, extender pigments (fillers), and perhaps additional additives selected for particular applications and purposes. Typical powder coatings would also commonly be found to contain a charging agent to assist in the process of charging the powder and the retention of charge for application onto the substrate to be coated.

Furthermore, agents may be added to powder coatings for the purpose of adjusting the viscosity to improve the smoothness and wetting characteristics of the applied coating. Such flow control agents are commercially available in a variety of formulations from a variety of vendors.

Agents may also be added to powder coating formulations to increase storage life by hindering thermosetting or radiation curing until deliberately undertaken in the curing of the coating. Such inhibitors may take the form of very small amounts of chemicals intended to suppress curing initiated by very small quantities of initiators accidentally induced. However, when deliberate curing is commenced, such cure-suppression agents would typically be completely overwhelmed by curing reactions and have no substantial effect on the curing process.

In addition to the above additives, the particular resins or other agents are typically added by the powder coating manufacturer for the purpose of providing the coating color, texture, gloss, hardness, radiation resistance, etc. which are commonly used to set apart one coating from another in the market.

The typical curing agents used in powder coating heretofore are thermosetting in which, under application of suitable heat from a bake oven or heating lamps, the curing agent causes the powder coating to harden into the desired finish. Epoxy and other heat-induced chemical reactions are typical means by which thermosetting curing occurs. However, as noted above, thermal curing of powder coatings offers several disadvantages. Certain substrate materials (such as wood or certain plastics) may not be heated above a certain temperature without causing harm to the material. This can place serious or insurmountable challenges in the way of thermal cures in striving to lower the cure temperature to an acceptable level while retaining the desired coating properties. UV curable coatings, such as the present invention, would be one way around thermal curing for heat-sensitive workpieces.

Also, certain workpieces are difficult to heat to the desired level due to the sheer bulk of the workpiece. For example in the application of powder coatings to certain motor vehicles is it not practical to heat the entire vehicle in its assembled state to the required curing temperature. Infra-red heating elements may ameliorate this problem somewhat. A uv curable powder coating would offer significant advantages in processing speed for large workpieces.

The prospective advantages of combining uv curable materials with powder coatings have attracted some previous work. Meixner et. al. (U.S. Pat. No. 5,068,305) describe uv curable powder coatings based upon chemical species containing (meth)acryloyl groups ($=C=C=$). The work of Wittig and Gehtmann (RADTECH European Conference, 1993) describes several uv curable powder coatings, distinct in chemical formulation from those disclosed by the present invention. Iwase et. al. describe in U.S. Pat. No. 3,974,303 a uv curable powder coating in very broad terms derived from thermoplastic( thermally curable) powder coatings. Iwase states that any thermoplastic powder coating can be used as a uv curable powder coating so long as the restriction of 0.5 to 3.5 polymerizable unsaturated bonds per 1000 molecular weight of resin is met (col. 2, lines 41–44). Thus, Iwase apparently excludes the important class of epoxides lacking unsaturation; i.e. bisphenol epoxides (Equation (1) below), epoxy novolacs and epoxy cresol novolacs (Equations. (2) and (3) below), and similar resins lacking the unsaturation required by Iwase. The examples provided by Iwase do not provide specific chemical structures for the resin, but method of synthesis. The present invention, by way of contrast, discusses specific chemical formulations, allowing thereby powder coating to be produced from known chemicals.

The work of McGinniss (U.S. Pat. Nos. 4,129,488 and 4,163,810) describes novel chemical compounds containing epoxy functionality bonded with ethylenically unsaturated polymers to form a compound, claimed by the inventor, to be suitable for uv curable powder coatings. The present invention does not involve a synthesis of specific and novel compounds for use as uv curable resins.

The present invention relates to a formulation of compounds which leads to uv curable powder coatings without the necessity of synthesizing special compounds, or choosing from among an extremely broad class of thermoplastic compound, such as in Iwase. The present invention demonstrates the formulation and use of uv curable powder coatings from chemicals typically made available for use for other purposes. Thus, the formulation and processing of the present invention offers the possibility of uv curable powder coatings from reasonably available compounds and improved performance in certain applications on certain workpieces by the use of special additives and processing of additives prior to use.

SUMMARY OF THE INVENTION

The present invention relates to powder coatings curable by exposure to radiation, typically ultraviolet radiation. Powder coatings based upon cationically catalyzed resins (typically epoxy resins) are described including bisphenols, bisphenols modified by novolac, as well as aliphatic type epoxides including hydrogenated bisphenol A, glycidyl methacrylic, glycidyl acrylics or related compounds, and vinyl ethers including mixtures of the foregoing compounds. Photoinitiators of sulfonium type, ferrocinium type, iodonium type, triphenolic types and related compounds are also included. Opacifiers, flow agents and plasticizers are also included. Charge additives for improved electrostatic deposition of the power coating are also described. Degassing agents are also typically included in the formulation, both for degassing the powder coating during cure, and to assist in degassing those substrates (such as wood) which tend to form bubbles during cure. Flow agents are also typically included in the formulation. Solidification of photoinitiators prior to use, and the addition of hydroxyl polyesters are shown in the present invention to lead to improved curing and coating performance.

OBJECTS OF THE INVENTION

A primary object of the present invention is to provide a powder coating curable by means of exposure to radiation.

Another object of the present invention is to provide a powder coating curable by means of exposure to ultraviolet radiation.

Yet another object of the present invention is to provide a powder coating, curable by exposure to radiation, based upon cationic curing.

Yet another object of the present invention is to provide a powder coating, curable by exposure to radiation, based upon cationic curing resins of the general chemical types; bisphenols, bisphenols modified by novolac, aliphatic type epoxides, hydrogenated bisphenol-A, glycidyl methacrylic, glycidyl acrylics or chemically related compounds, vinyl ethers and mixtures of the foregoing compounds.

Another object of the present invention is to provide methods of preparation of radiation-curable resins suitable for application to substrates by electrostatic deposition means.

Yet another object of the present invention is to improve the performance of powder coatings by the addition of hydroxyl polyesters, hydroxyl acrylics, or phenolic hydroxyl compounds.

Yet another object of the present invention is to improve the performance of powder coatings by the solidification of photoinitiators prior to use.

Another object of the present invention is to provide a photocurable powder coating for deposition onto a substrate by means of electrostatic deposition.

Yet another object of the present invention is to provide a method of coating a substrate with a photocurable powder coating.

BRIEF DESCRIPTION OF DRAWINGS

This invention has no drawings.

DESCRIPTION OF PREFERRED EMBODIMENTS

The present invention relates to the chemical composition and to the use of powder coatings curable by exposure to radiation following deposition of said powder onto a workpiece or substrate. Typical deposition methods would be deposition from a fluidized bed or electrostatic deposition. The most common means of electrostatic deposition would involve causing the powder to acquire an electrostatic charge (typically by means of corona discharge or tribocharging) prior to deposition of the powder onto the substrate. The particular method of deposition of the powder onto the substrate is not the subject of the present invention and will not be discussed in detail herein.

The powder coating is typically in the form of a "resin" with numerous additives for color, charging, flow control, etc. as described in more detail elsewhere herein. The resin itself is typically a polymer which has unreacted functional groups capable of cross-linking, additional polymerization, or a variety of other chemical reactions leading to the final coating. This second category of chemical reactions leading to the final coating is generally referred to as "curing" the coating to distinguish from polymerization, or other reactions necessary to form the resin itself. The resin may also be known as a "prepolymer" or "oligomer" since the full polymerization (or the full expansion of molecular weight by whatever chemical reaction) has not yet occurred. However, these terms "prepolymer" and "oligomer" are more typically used in conjunction with liquid coatings cured by radiation. We will use the term "resin" herein to denote the material deposited onto the substrate prior to the occurrence of the final curing or polymerization reactions. The present invention, in contrast to the work of McGinniss cited above, is not directly concerned with the reactions (polymerization or otherwise) going into the formation of the resin. Rather, the present invention is concerned with a particular chemical composition of resins and additives capable of curing by means of radiation, typically ultraviolet radiation, (and capable of flowing at significantly lower temperatures than that described by the Iwase patent above), leading to an improved powder coating and capable of use on heat sensitive substrates such as wood, certain plastics, etc.

In the case of typical thermosetting powder coatings, the application of heat is used to flow the powder into a uniform film and to cause the curing reactions to proceed. The present invention uses radiation (typically uv) for curing the powder coating, but still has the need for modest heating to cause the powder coating to flow into a uniform covering of the substrate. This is one of many differences between powder and liquid coatings in which the different physical nature of the film forming process requires inherently different processing steps. The present invention will generally find its most useful areas of application when the substrate requires heating (to flow the powder coating into a uniform film) to temperatures no higher than 100 degrees Celsius. Heating substantially above this temperature will tend to re-introduce into the coating system many of the problems associated with genuine thermosetting resins, and which are sought to be avoided by the use of uv cures. Therefore, it is frequently helpful to use in combination with the uv curable resin a plasticizer compound for the lowering of the melting-flowing temperature of the resin. Specific plasticizers will be discussed in more detail below in conjunction with the specific resin systems of the present invention.

The heating step in order to flow the powder coating into a uniform film can be performed by a variety of methods, some better than others at reducing the heat input to the workpiece. Heating the workpiece in a conventional oven is certainly one common method. However, heating by means of lamps is one method for delivery of heat to the surface of the workpiece in order to cause flow of the powder coating without the necessity of heating the entire bulk of the workpiece. Infra-red radiation is the common method for applying such radiation, although other forms of radiant energy may be employed as well. The uv radiation itself may be used to heat the powder coating for flow purposes as well as for curing. Such procedures for minimizing the heating of the workpiece are well known in the field of thermosetting powder coatings, and will not be described in detail herein other than to point out that minimization of heating is an important goal of the present invention.

The heating procedure to cause the powder coating to flow into a uniform coating of the surface is an important distinction between powder and liquid coatings in which heating for flow over the surface is not necessary. The liquid coating itself, or as diluted in a solvent, generally is formulated specifically with sufficiently low viscosity to cover the surface adequately (or diluent added until such is the case). The complexity of heating and maintaining a low flow temperature is but one of the problems to be treated in development of a uv curable powder coating in which nothing is to be learned from the technology of liquid uv curable coatings.

Drawing an approximate analogy with liquid uv curable coatings, there are two general classes of chemical curing mechanisms employed for effecting photocure: chemical species curing by means of cationic curing mechanism and those curing by means of free radical curing mechanisms. In the case of cationic curable coatings, the reactive functionality on the resin reacts in the curing step by means of positively charged chemical species. In the case of free radical curable resins, the reactive functionality of the resin reacts during the curing step by means of free radical (uncharged) intermediate species. The present invention relates to powder coatings in which cationic curing is generated by means of exposure to radiation.

The present invention relates generally to vinyl ether and epoxide type cationic curing resins as specially formulated for application and use as a powder coating. As described in detail herein, aromatic as well as aliphatic and cycloaliphatic epoxide compounds can be employed in the practice of the present invention.

One embodiment of the present invention uses epoxide type resins as the basis for the uv curable powder coating system. Typical epoxide type resins would be those related to bisphenol A epoxies. In particular, the bisphenol A resin found most useful in the practice of the present invention is a modified bisphenol A epoxy diglycidyl ether as shown in Equation (1).

Equation (1)

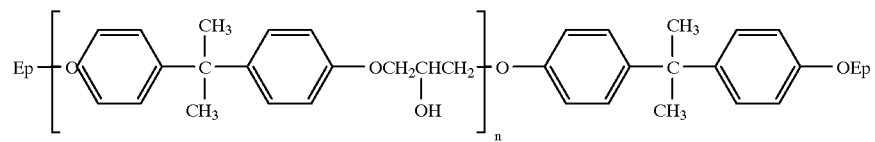

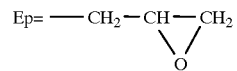     Typically, n = 1 – 7

Bisphenol A Epoxy Diglycidyl Ether

Variations on the bisphenol A epoxide structure as shown in Equation (1) can also be used such as bisphenol F, bisphenol S, etc.

In addition to the bisphenol epoxide resins of the general type described above, the present invention may also use epoxides derived from novolacs, (generally referred to as epoxy novolacs or novolac epoxides), typically as shown in Equation (2).

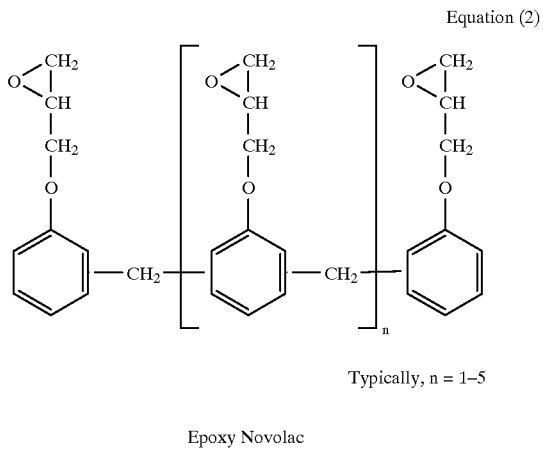

Typically, n = 1–5

Epoxy Novolac or the variation, epoxy cresol novolac, Equation (3).

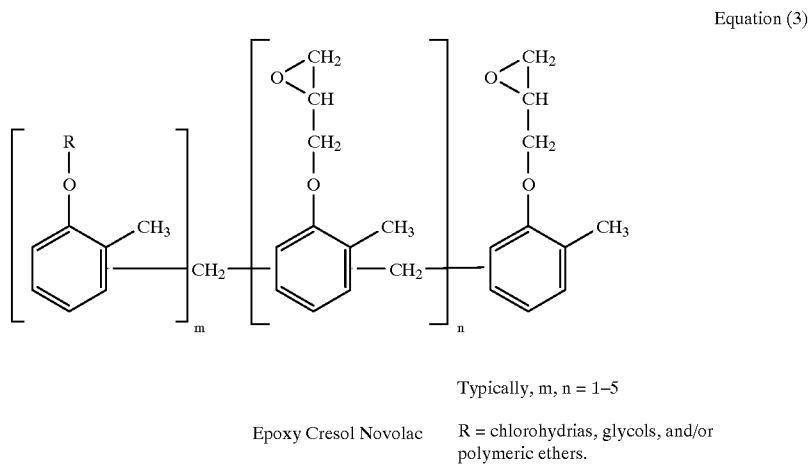

Typically, m, n = 1–5

Epoxy Cresol Novolac    R = chlorohydrias, glycols, and/or polymeric ethers.

Equations (1) through (3) are based upon aromatic groups. It is also possible in the practice of the present invention to use aliphatic-type epoxide resins. For example, hydrogenated bisphenol A Equation (4), glycidyl acrylate Equation (5), and glycidyl methacrylate Equation (6) are all useful resins for the practice of the present invention.

A commercially available bisphenol A of the general type of Equation (1) is available from Ciba-Geigy under the tradename "GT9013"; a mixture of compounds of Equation (1) with an effective value of "n" of about 2.5. A mixture of compounds of the forms given by Equation (1) and Equation (3) is available from Ciba-Geigy under the tradename "GT6259". Such compounds and mixtures have proven to be useful in the practice of the present invention, not thereby excluding other compounds disclosed herein.

Such compounds, and mixtures thereof, have been made commercially available from a variety of vendors for use as liquid coatings. As such, they are typically supplied in liquid form, or supplied with solvent diluents for purposes of application to a workpiece. The present invention requires such compounds in a substantially dry, solid form. Therefore, solvents must be evaporated prior to use and specific compounds inherently a liquid at low temperatures are not feasible for use in powder coatings. While such compounds have found utility in liquid uv curable coatings, the present invention is believed to be the first in which such compounds are shown to have utility in the production of powder coatings as well.

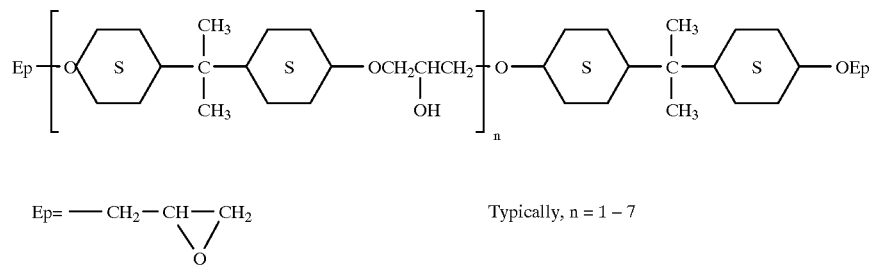

Typically, n = 1 – 7

Hydrogenated Bisphenol A Epoxy Diglycidyl Ether

Equation (5)

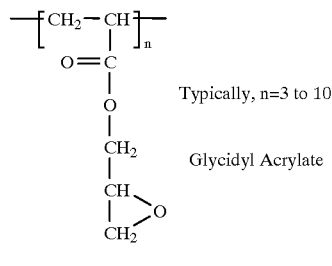

Typically, n=3 to 10

Glycidyl Acrylate

Equation (6)

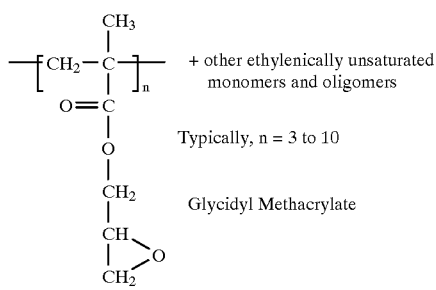

+ other ethylenically unsaturated monomers and oligomers

Typically, n = 3 to 10

Glycidyl Methacrylate

Vinyl ethers of the general structure given in Equation (7) are also useful resins in the practice of the present invention. Several typical specific structures are given in Equations (7a) and (7b), not intended thereby to limit or to restrict the present invention, but to serve as illustrative examples.

type resins), the typical resins of Equations (1)–(7) are blended in powder form with a suitable photoinitiator. The above resins may be used singly, in mixtures, or in forms having modified chemical structures not substantially affecting the chemical properties of the resins.

Equation (7)

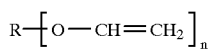

R is typically aromatic, aliphatic, alicyclic hydrocarbons or ethers or polyethers, esters or polyesters, urethanes or polyurethanes and n = 1–4

Vinyl Ethers

Equation (7a)

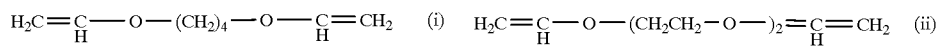

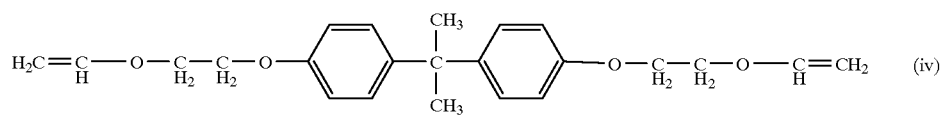

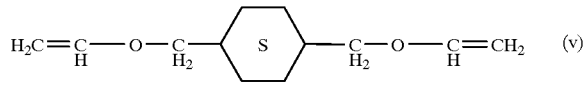

Equation (7b)

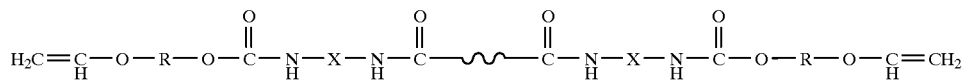

(i) Vinyl ether terminated urethanes monomers and oligomers

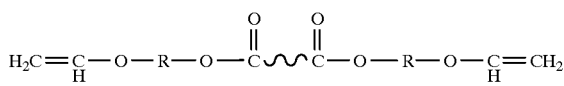

(ii) Vinyl ether terminated esters monomers and oligomers

In the practice of the present invention for uv curable resins (as generally using cationic curing chemical reactions as generally described herein as epoxide type or vinyl ether It is not necessary to limit mixtures to all epoxide or all vinyl ether type resins in the blend. Since both epoxides and vinyl ether resins cure by means of cationic curing mechanisms, it is quite feasible in the practice of the present invention to blend epoxide and vinyl ether powder resins (with appropriate photoinitiators and other components as described elsewhere herein) to produce a useful powder coating.

It is also possible to combine certain of the cationic curing powder coatings as described herein with powder coating resins which cure by means of free radical curing mechanism. In particular, acrylourethane type resins shown in Equation (7c), and unsaturated polyester type resins, Equation (7d) are useful for combining with cationic curing resins of the present invention in mixtures, leading to effective powder coating formulations.

Acrylourethane type resins

Equation (7c)

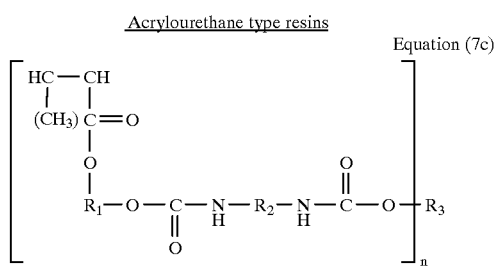

n = 1, 2, 3
$R_1$ = alkyl
$R_2$ = aryl, alkyl or alicyclic
$R_3$ = hydrocarbon backbone for mono-ol, diol, triol reactant for n = 1, 2, or 3 respectively Equation (7d)

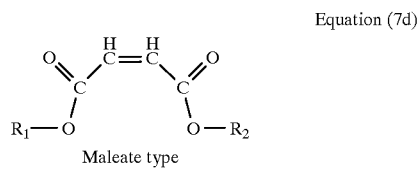

Maleate type

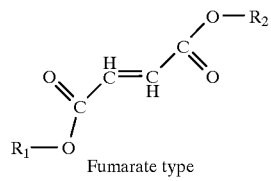

Fumarate type $R_1$, $R_2$ = oligomer or polymer consisting of glycols and mono or polybasic acids Unsaturated Polyester Resins The preferred photoinitiators for the present invention are sulfonium-type photoinitiators known commercially as UVI 6974 and UVI 6990 as sold by the Union Carbide Corporation. The general chemical structures of such sulfonium-type photoinitiators are given in Equations (8a) and (8b).

Equation (8a)

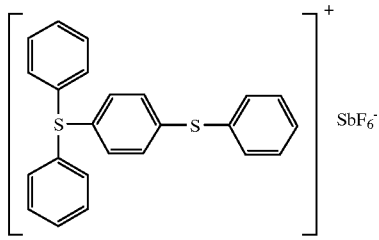

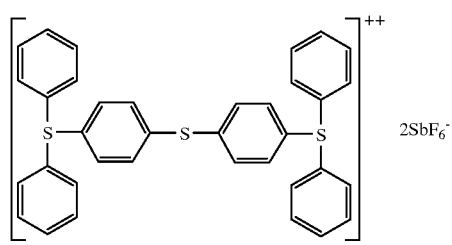

Mixed Triarylsulfonium
Hexafluoroantimonate Salt
UVI-6974

Equation (8b)

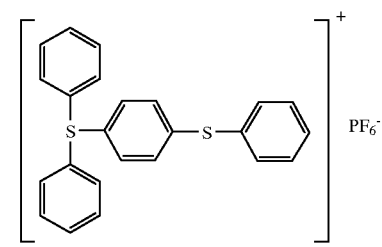

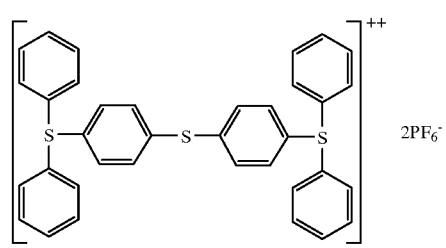

Mixed Triarylsulfonium
Hexafluorophosphate Salt
UVI-6990

The above photoinitiators are typically supplied by the commercial vendor in the form of approximately 50% solids in propylene carbonate. This is perhaps the preferred formulation for the use of such photoinitiators for liquid uv curable coatings. However, the present invention is concerned with powder coatings. For this purpose, it is found that photoinitiators in the form of a solid give improved performance. Thus, one feature of the present invention is to evaporate the solvent and use the photoinitiator in the form of a solid. In general, any materials in the present invention which are commonly in the form of a liquid are suspect in the practice of the present invention. The processing of the uv curable powder, when substantial liquids are present in at least one of the components, may cause improper processing to occur. Clumping, and sticking to other particles may occur, impeding the processing and application to the workpiece by means of typical powder coating procedures. Thus, in general, for the practice of the present invention for uv curable powder coatings, it is generally useful to use materials as much as possible in dry, powder form. This may involve preliminary evaporation or other processing steps for those materials not typically supplied as powder. Although described herein in conjunction with certain specific photoinitiators, these procedures are generally applicable to the practice of the present invention. Previous work directed to liquid photocurable coatings will occasionally use terminology like "100% solids, pourable", or "low viscosity 100% solids" (e.g. Smith U.S. Pat. No. 4,318,766). When referring to liquid coatings (as is Smith), such terminology denotes formulations lacking solvent, but still essentially a liquid phase material. This is in contrast to the usage herein in which "solid" is used to mean a solid phase material, typically in the form of a powder.

Ferrocinium-type photoinitiators (known commercially as "Irgacure 261" by Ciba-Geigy: $\eta^5$-2,4-(cyclopentadienyl) {(1,2,3,4,5,6-$\eta$)-(methylethyl)-benzene}—iron(II), and related compounds) are also useful in the practice of the present invention. See Equation (9). Although typically not as useful as the sulfonium-type photoinitiators of Equation (8), the ferrocinium-type photoinitiators have the advantage of being typically supplied in the form of a powder, eliminating the necessity for preliminary evaporation or other processing.

Equation (9)

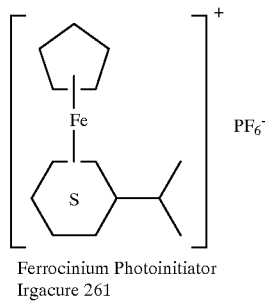

Ferrocinium Photoinitiator
Irgacure 261

In addition, iodonium salts of the general chemical structure given in Equation (10) are also useful for the practice of the practice of the present invention.

Equation (10)

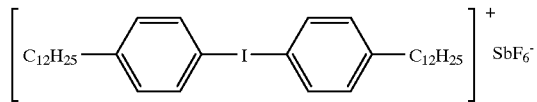

Bis-(dodecylphenyl)-iodonium hexfluorantimonate
mixture of isomers

Benzil dimethyl ketal, shown in Equation (10a), can also be successfully employed as a photoinitiator in the practice of the present invention.

Equation (10a)

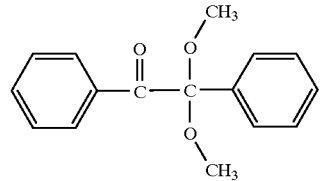

Benzil dimethyl ketal

It is not necessary for a single photoinitiator to be used in the practice of the present invention, although this is envisioned to be the most common mode of practice. Mixtures of photoinitiators for different properties, such as wavelength specificity, may be used as mixtures in special cases.

We have described above typical resins and photoinitiators used in the production of uv curable powder coatings in which cationic cure is the chemical curing mechanism. In addition to resins and photoinitiators, it is often useful to include a "synergist" or "photosensitizer". The purpose of a photosensitizer is to increase the range of uv wavelengths at which energy is absorbed from the incident radiation, increasing thereby the efficiency of light utilization by the photosensitizer-photoinitiator system. The photosensitizer will typically absorbed a uv photon of a wavelength not readily absorbed by the photoinitiator itself. Energy (or perhaps an electron) will then be transferred from the photosensitizer to the photoinitiator, allowing the reaction to commence, in effect initiated by a photon not absorbed by the photoinitiator. Typical examples of photosensitizers which have proven useful in the formulation of uv curable powder coatings in the present invention include: cumene hydroperoxide (Equation (11)), anthracene (Equation (12)), or one or more of a family of thioxanthone derivatives (Equation (13) and chemically similar photosensitizers), such photosensitizers used singly or in combination.

Equation (11)

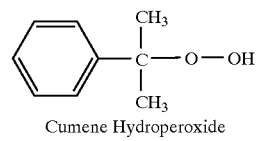

Cumene Hydroperoxide

Equation (12)

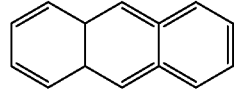

Anthracene

Equation (13)

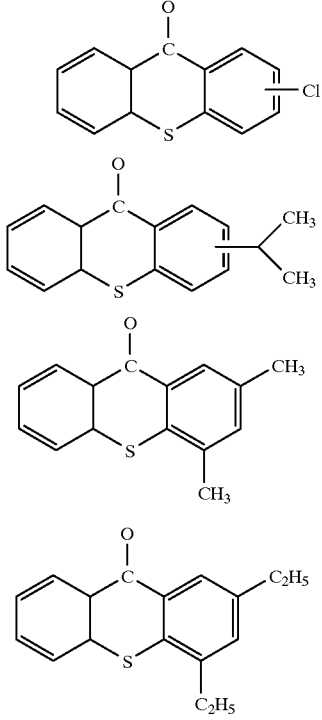

Typical thioxathone derivatives

An important feature of the present invention is to provide uv curable powder coatings with low flow temperatures, typically less than 100 degrees Celsius. In order to achieve lower flow temperatures, an additive in the form of a "plasticizer" is added. To lower the flow temperature of the cationic curing resins of the present invention, it is found that the use of a solid plasticizer is generally useful. Commonly used solid plasticizers include sulfonamides, benzoates, castor oil derivatives, toluene sulfonamides, dicyclohexylphthlates, or epoxidized soya oil. In the practice of the present invention, it is found that epoxidized soya oil is generally useful, although other conventional solid plasticizers, as enumerated above, may also be employed, singly or in combinations.

Cationic curing powder coatings can be formulated in numerous ways using the resins, photoinitiators, photosensitizers, and plasticizers as discussed above. In addition to these components of the formulation, a typical powder coating may also include flow control agents, degassing agents, pigments and other additives as discussed above in conjunction with the general discussion of powder coatings. Pigmented additives in powder coatings pose special challenges for uv curing systems since, in most of the usual cases, the pigments will absorb uv radiation in addition to the visible radiation (the absorption of which causes them to be pigments in the first place).

However, an important feature of the present invention is the addition of hydroxyl-containing compounds (typically polyesters) to epoxide resin (or resins). In the present invention, it is found that the addition of hydroxyl polyesters, hydroxyl acrylic compounds or phenolic hydroxyl compounds have beneficial effects on the final coating following uv cure. In general, the addition of any of these compounds tends to increase the flexibility of the final coating. Hydroxyl polyester compounds, however, tend to increase the speed of cure and also increase the chemical resistance of the final cured coating. (The resistance to chemicals is tested by means of methyl ethyl ketone).

For use with the present invention, it is found that hydroxyl polyesters, having a hydroxyl number in the range of approximately 290 to 310, enhances the curing properties of the powder coating as well as the flexibility and chemical resistance properties of the final coating. ("Hydroxyl number" is determined according to Test Method TM 2430 in common use for the analysis of powder coatings, resins, and related or component materials.) A commercially available compound, typically found to be suitable for use in connection with the practice of the present invention, is known by the tradename "RUCO-108", from the RUCO Polymer Co.

It is found in the present invention that addition of hydroxyl polyesters to the curing resin in a ratio of approximately 2 to 7 hydroxyl groups derived from the polyester to epoxide groups of the resin provides enhanced properties both in curing and in the final cured coating. Thus, an important feature involved in the present invention is the inclusion of hydroxyl polyester compounds in cationically curing epoxy resins. In general, it is found that hydroxyl polyesters having terminal hydroxyl groups tend to give better performance in the final cured coating, although other forms of hydroxyl polyesters are not thereby excluded. While virtually all combinations of resins, photoinitiators and photosensitizers described above will lead to useful uv curable powder coatings, particularly good performance is found using commercially available mixtures of epoxy cresol novolac (Equation (3)) and bisphenol A epoxy diglycidyl ether (Equation (1)) in conjunction with sulfonium-type photoinitiators (Equation (8)). When mixed with hydroxy polyester of the type, and in the ratio, described above, particularly good powder coatings are achieved with curing by uv radiation having wavelength in the range of approximately 250 to 280 nanometers, and an exposure in the range of approximately 2.0 to 4.0 joules per square centimeter of coating area.

We discuss herein specific examples of compounds of the general types given above as typical examples of powder coatings curable by means of uv radiation. It is not intended thereby to exclude other compositions, formulations or mixtures which would be obvious to one of ordinary skill in the art or ascertainable by means of routine experimentation. The examples presented herein are intended to be illustrative and not limiting, and presented as typical uv curable powder coatings leading to good coatings possessing a degree of impact resistance and solvent resistance which are adequate for many practical applications. Unless otherwise stated, all percentages or proportions given herein are by weight of the particular component.

Vinyl Ether

Equal parts by weight of a vinyl ether (of the type of Equation 7(b)(i)) are mixed with an acrylourethane of the type of Equation 7(c). In particular, aromatic urethane divinyl ethers of the type made commercially available by the Allied Signal Company under the tradename "VEctomer" have proven to be useful vinyl ethers. A particular acrylourethane made commercially available by the Hoechst Corporation as "VXL-1385" has proven to be useful. To this equal part mixture is added a suitable photoinitiator in an amount of approximately 3% by weight of the mixture. Benzil dimethyl ketal (Equation (10a)) is useful as a photoinitiator in connection with this formulation.

Vinyl Ether—Epoxide Blend

VEctomer aromatic urethane divinyl ether of the type given in Equation (7b)(i) is blended with a mixture of bisphenol A epoxide resins (of the type given in Equation (1)) and epoxy cresol novolac (Equation (3)). The commercial compound made available by Ciba-Geigy under the tradename "GT 6259" is a blend of bisphenol A and epoxy cresol novolac resins found to be useful in the practice of the present invention. Equal parts of VEctomer and GT 6259 are mixed together. To said mixture is added about 3% by weight of a photoinitiator, typically "UVI 6974" as given by Equation (8a).

Epoxide

The blended bisphenol A and epoxy cresol novolac described above as "GT 6259" is combined with approximately 2% by weight of photoinitiator. "UVI-6974" (Equation (8a)) has proven to be a useful photoinitiator in the practice of the present invention utilizing these particular epoxy resins.

Epoxide Including Hydroxyl Polyester

A bisphenol A epoxide resin of the type given in Equation (1) is blended with a hydroxyl polyester having terminal hydroxyl functionality (typically RUCO 108). A mixture of bisphenol A resins of the type given in Equation (1) is made commercially available by Ciba Geigy under the tradename "GT 9013", having a blend of components such that the effective "n" of Equation (1) is approximately 2.5. Epoxidized soya oil, a flow agent and a photoinitiator (typically UVI 6974, Equation (8a)) are mixed in approximately the following proportions:

| GT 9013 | 100 |
| RUCO 108 | 11.1 |
| Epoxidized Soya Oil | 3.4 |
| Flow Agent | 3.7 |
| UVI 6974 | 3.6 |

Having described the invention in detail, those skilled in the art will appreciate that, given the present disclosure, modifications may be made to the invention without departing from the spirit of the inventive concept herein described. Therefore, it is not intended that the scope of the invention be limited to the specific and preferred embodiments illustrated and described. Rather, it is intended that the scope of the invention be determined by the appended claims.

We claim:

1. A process for obtaining a cured powder coating on the surface of a workpiece comprising the steps of:
   a) providing a photopolymerizable composition comprising:
      i) at least one epoxy resin compound;
      ii) at least one photoinitiator selected from the group consisting of sulfonium photoinitiators, ferrocinium photoinitiators, and iodonium photoinitiators;
      iii) a solid plasticizer; and,
      iv) a hydroxyl containing compound selected from the group consisting of hydroxyl polyester compounds, hydroxyl acrylic compounds and phenolic hydroxyl compounds; and,
   b) blending said photopolymerizable composition as substantially dry solid powder; and,
   c) depositing said solid blended powder onto the surface of a workpiece; and,
   d) curing said deposited solid powder by means of exposure to radiation.

2. A process as in claim 1 wherein said powder coating is deposited onto said surface by means of electrostatic deposition.

3. A process as in claim 1 further comprising, immediately following step (c) thereof, the step;
   c') heating said surface of said workpiece and said powder thereon sufficiently to cause said powder to flow and coalesce into a substantially uniform coating.

4. A process as in claim 3 wherein said heating is to a temperature not exceeding approximately 100 degrees Celsius.

5. A process as in claim 1 wherein said photopolymerizable composition further comprises at least one photosensitizer selected from the group consisting of; cumene hydroperoxide, anthracene, and thioxanthone type photosensitizers.

6. A process as in claim 1 wherein said at least one photoinitiator is a substantially 100% dry solid.

7. A process in claim 1 wherein said at least one compound, said at least one photoinitiator, said solid plasticizer are in the form of substantially dry solids.

8. A process as in claim 1 wherein said solid plasticizer is selected from the group consisting of; sulfonamides, benzoates, plasticizing castor oil derivatives, toluene sulfonamides, dicyclyhexlphthlates, and epoxidized soya oil.

9. A process as in claim 1 wherein said photopolymerizable composition further comprises:
   d) at least one resin selected from the group consisting of acrylourethane type resins and unsaturated polyester type resins.

10. A process as in claim 9 wherein said photopolymerizable composition further comprises at least one vinyl ether type photopolymerizable compound.

11. A process as in claim 1 wherein said hydroxyl containing compound is a hydroxyl polyester having a hydroxyl number in the range of approximately 290 to 310.

12. A process as in claim 11 wherein said hydroxyl polyester comprises a proportion of said coating such that the ratio of hydroxyl groups of said hydroxyl polyester to epoxide groups of said resin is in the range of approximately 2 to 7.

13. A process as in claim 1 wherein said hydroxyl containing compound has terminal hydroxyl groups.

14. A process as in claim 1 wherein said hydroxyl containing compound is in the form of substantially dry solid.

15. A process as in claim 1 wherein said resin compound is selected from the group consisting of bisphenol A epoxy diglycidyl ether, novolac epoxides, hydrogenated bisphenol A epoxy diglycidyl ether, glycidyl acrylic compounds, glycidyl methacrylic compounds, and cycloaliphatic epoxy compounds.

16. A process as in claim 15 wherein said plasticizer is provided in sufficient concentration in said powder to cause the flow temperature of said powder to less than approximately 100 degrees Celsius.

* * * * *